United States Patent
Mead et al.

(10) Patent No.: US 7,184,616 B2
(45) Date of Patent: Feb. 27, 2007

(54) METHOD AND APPARATUS FOR FIBER BRAGG GRATING PRODUCTION

(75) Inventors: Roy M. Mead, Edmonds, WA (US); Charles I. Miyake, Kirkland, WA (US)

(73) Assignee: Aculight Corporation, Bothell, WA (US)

( * ) Notice: Subject to any disclaimer, the term of this patent is extended or adjusted under 35 U.S.C. 154(b) by 949 days.

(21) Appl. No.: 10/040,286

(22) Filed: Oct. 29, 2001

(65) Prior Publication Data

US 2002/0114553 A1 Aug. 22, 2002

Related U.S. Application Data

(60) Provisional application No. 60/276,651, filed on Mar. 16, 2001, provisional application No. 60/269,150, filed on Feb. 15, 2001, provisional application No. 60/269,152, filed on Feb. 15, 2001, and provisional application No. 60/249,989, filed on Nov. 20, 2000.

(51) Int. Cl.
   *G02F 1/295* (2006.01)

(52) U.S. Cl. ............................ 385/10; 385/37; 359/326; 359/327; 359/328; 359/329; 359/330; 359/331; 359/332

(58) Field of Classification Search ................... 385/10, 385/37; 359/326–332
See application file for complete search history.

(56) References Cited

U.S. PATENT DOCUMENTS

| | | | | |
|---|---|---|---|---|
| 5,363,239 A | * | 11/1994 | Mizrahi et al. | 359/570 |
| 5,400,422 A | * | 3/1995 | Askins et al. | 385/37 |
| 5,708,738 A | * | 1/1998 | Perez et al. | 385/37 |
| 5,768,454 A | * | 6/1998 | Chesnoy et al. | 385/37 |
| 5,818,988 A | * | 10/1998 | Modavis | 385/37 |
| 5,822,479 A | * | 10/1998 | Napier et al. | 385/37 |
| 6,298,184 B1 | * | 10/2001 | Putnam et al. | 385/37 |
| 6,307,679 B1 | * | 10/2001 | Kashyap | 359/569 |
| 6,310,996 B1 | * | 10/2001 | Byron | 385/37 |
| 6,373,869 B1 | * | 4/2002 | Jacob | 372/22 |
| 2001/0012138 A1 | * | 8/2001 | Sugitatsu et al. | 359/15 |
| 2001/0043774 A1 | * | 11/2001 | Tormen | 385/37 |
| 2002/0149836 A1 | * | 10/2002 | Jovanovic et al. | 359/328 |

* cited by examiner

*Primary Examiner*—Brian Healy
*Assistant Examiner*—Daniel Valencia
(74) *Attorney, Agent, or Firm*—Bingham McCutchen, LLP; David G. Beck

(57) ABSTRACT

Fiber Bragg writing devices comprising solid state lasers are provided. The solid state lasers comprise optical parametric oscillators and emit moderate peak-power output beams at wavelengths which are suitable for efficient production of fiber Bragg gratings without causing embrittlement of the optical waveguide. These solid state lasers generate output beams with wavelengths of approximately 240 nm, in order to match the primary absorption peak in the ultraviolet range for a typical optical waveguide. Some of these solid state lasers generate tunable wavelength beams using an optical parametric oscillator ("OPO"), then generate harmonics of these tunable beams. Other lasers mix the tunable beam with fixed wavelengths derived from the pump laser to reach the desired output wavelength.

33 Claims, 16 Drawing Sheets

METHOD AND APPARATUS FOR FIBER BRAGG GRATING PRODUCTION

CROSS-REFERENCES TO RELATED APPLICATIONS

This application claims priority based on the following U.S. Provisional Patent Application Ser. Nos., the disclosures of which are incorporated herein by reference for all purposes: 60/249,989, filed Nov. 20, 2000; 60/269,150, filed Feb. 15, 2001; 60/269,152, filed Feb. 15, 2001; and 60/276,651, filed Mar. 16, 2001.

FIELD OF THE INVENTION

The invention relates generally to the field of optical waveguide manufacturing and particularly to the processing of optical fibers to create fiber Bragg gratings.

BACKGROUND OF THE INVENTION

Fiber Bragg gratings (FBG's) are portions of optical waveguides, such as optical fibers, which have been processed to reflect and transmit specific wavelengths. The waveguides are typically germanium-doped silica fibers and for the purposes of this description will be referred to as "fibers" or "optical fibers." However, it should be understood that these terms are being used in a generic sense to mean any type of optical waveguide.

Producing FBG's involves exposing the fiber to ultraviolet light, the intensity of which varies between light and dark along the length of the fiber. The light and dark bands of exposure are placed along the fiber with spacing comparable to the wavelength of light to be reflected by the fiber in operation. The ultraviolet light induces changes in the index of refraction of the fiber, producing an index grating along the length of the fiber.

A light source used for exposure of a fiber to make FBG's must provide light within specific ranges of wavelengths in the ultraviolet portion of the spectrum. A typical fiber's primary wavelength range for absorption peaks near 240 nm, and wavelengths differing from the peak by more than about 10 nm are significantly less effective. Even at the peak wavelength, only a small fraction of the laser power is absorbed, so it is highly desirable for the light source to provide light at a wavelength near the absorption peak.

Unfortunately, the current sources of ultraviolet light used for FBG production have various drawbacks. Most current production systems for FBG's use either KrF excimer lasers emitting at 248 nm, or frequency-doubled argon-ion lasers at 244 nm, to expose the fibers. KrF excimer lasers can produce high average powers, which facilitates processing, but they have serious disadvantages. They require toxic, corrosive gases for operation, have high operating and maintenance costs, and produce short duration (~50 ns), low repetition rate (<1000 Hz), high peak output power (~1 MW) ultraviolet pulses. The high peak output powers cause damage to the fibers, weakening them and making them susceptible to fracture. The alternative continuous wave ("cw") argon ion lasers suffer high operating costs and produce weak output powers of one-half watt or less, leading to poor production throughput.

Several other types of lasers, including argon-fluoride and xenon-chloride excimer lasers and flashlamp-pumped lasers, have also been applied to FBG production. However, the argon-fluoride and xenon-chloride excimer lasers suffer from disadvantages similar to those of KrF excimer lasers. Flashlamp-pumped lasers provide some operational improvements compared to excimer lasers, but also generate high peak power pulses which damage the optical fibers.

Other lasers have also been used in laboratory demonstrations of FBG production. Frequency-doubled copper vapor lasers at 255 nm have been used, though their output wavelength is slightly too long to be optimal. Frequency-doubled liquid dye lasers have been tuned to the 240 nm region for FBG fabrication, but such lasers are impractical for large-scale industrial production, since they require very frequent changes of the liquid dye solution to maintain operation.

Solid-state lasers are being increasingly utilized for materials processing applications, due to their reliability and reasonable operating costs. Solid state lasers would be of great interest for FBG production, but heretofore have not been usable because they have not been able to produce the required wavelengths.

SUMMARY OF THE INVENTION

In order to address the shortcomings in prior art devices for making FBG's, the present invention discloses a variety of solid state lasers which generate moderate peak-power radiation at wavelengths suitable for FBG production. These lasers are used in combination with various devices for producing FBG's at a rate which exceeds that of current production devices. Moreover, the FBG's are produced without significant damage to the fibers, without exposing workers and equipment to toxic and corrosive gases and without the frequent maintenance required for other FBG systems.

According to one embodiment of the present invention, a light source provided for FBG production includes a solid state laser which generates tunable-wavelength beams using an optical parametric oscillator ("OPO"), then generates harmonics of these tunable beams to provide an output beam at a wavelength near the primary absorption peak of approximately 240 nm. The output beam is used as an illumination source in any of a wide variety of devices for producing FBG's.

According to another embodiment of the present invention, a light source provided for FBG production includes a solid state laser which generates tunable-wavelength beams using an optical parametric oscillator ("OPO"), then mixes the tunable beam with fixed wavelengths derived from a pump laser to produce an output beam with a wavelength and intensity suitable for FBG production. The output beam is used as an illumination source in any of a wide variety of devices for producing FBG's.

In one embodiment, the output beam from one of the foregoing embodiments is used to illuminate a proximity mask which causes a diffraction pattern to be imaged onto the fiber. In an alternative embodiment, a diffraction pattern from a phase mask is imaged onto a waveguide, such that a portion of the FBG may have a different period than that of the corresponding pattern of the phase mask.

In another embodiment, a holographic technique is employed: a beam splitter splits the output beam into two beams and interference between these two beams is used to create the FBG.

In still another embodiment, the output beam illuminates a phase mask interferometer which produces the FBG. According to several embodiments, the phase mask interferometer has mirrors for reflecting rays diffracted from the phase mask. According to one such embodiment, an actuator controls the lateral movement of at least one mirror. According to one embodiment, the distance between a first mirror and a direct ray is less than the distance between a second mirror and the direct ray. According to another embodiment, one or more mirrors may be rotated by an actuator. In some embodiments, the fiber is kept parallel to grating during FBG production, but in other embodiments the fiber is inclined with respect to the fiber. Moreover, the output beam may illuminate a single portion of the phase mask or may be scanned along the phase mask.

According to yet another embodiment, any of the previously described light sources illuminates a Lloyd mirror interferometer for producing FBG's.

According to other embodiments, a prism interferometer illuminated by any of the previously described light sources produces FBG's. According to one such embodiment, the prism interferometer includes a right angle prism. According to another such embodiment, an actuator rotates a prism to tune the Bragg wavelength of an FBG.

DESCRIPTION OF THE SPECIFIC EMBODIMENTS

A. Fabrication of Bragg Gratings

There are two basic methods of generating the necessary alternating light and dark regions of an FBG, with many variations of each method. The first is a "holographic" method, wherein two ultraviolet beams are caused to interfere with one another. The resulting interference pattern is projected onto the germanium-doped portion of the fiber. The second basic method is noninterferometric and involves exposure of the fiber to periodic ultraviolet ("UV") radiation.

1. Holographic Methods

Figure 1:
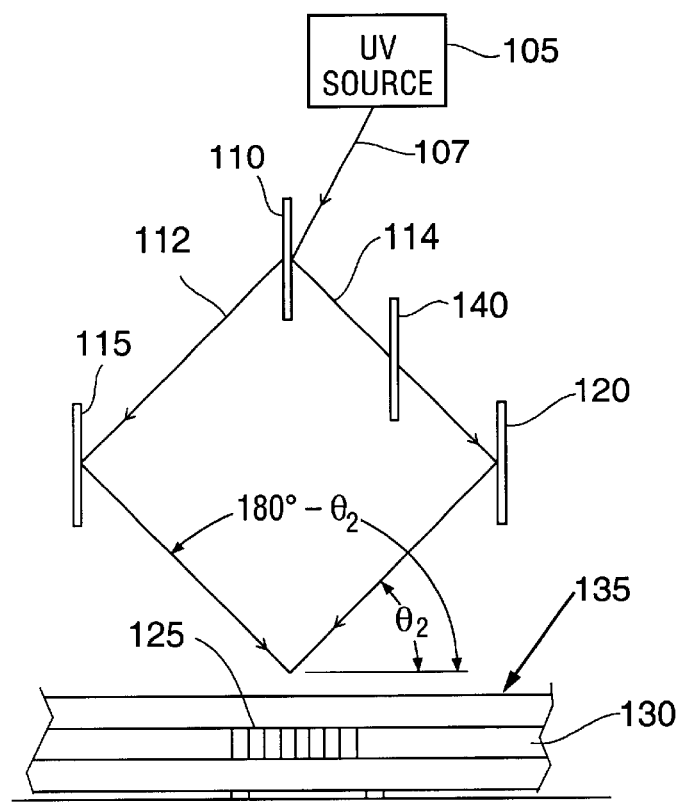
FIG. 1 is a schematic depiction of an FBG writing system which uses optics to produce an interference pattern on an optical fiber.

A basic holographic method is shown schematically in FIG. 1. There, ultraviolet source 105 (typically some form of laser) generates beam 107, which is split into beams 112 and 114 by beam splitter 110. For low-coherence sources, it is advantageous to equalize the path lengths of beams 112 and 114. In FIG. 1, these path lengths are equalized by disposing compensating plate 140 in the path of beam 114. Beams 112 and 114 reflect from mirrors 115 and 120, respectively, and are thereby directed to create interference pattern 125 in doped portion 130 of optical fiber 135. This method is described, for example, in U.S. Pat. No. 4,725,110 (see, for example, col. 1, line 56 through col. 2, line 68 and the referenced figures), the teachings of which are hereby incorporated by reference.

2. Proximity and Projection Masking Techniques

As noted above, the second basic method is noninterferometric and involves exposure of the fiber to periodic ultraviolet UV radiation. The periodic UV radiation can be generated, for example, by having the fiber and a pulsed UV source move relative to one another. Alternatively, the periodic UV radiation can be generated using a spatially periodic grating mask (also known as a "phase mask" or "phase grating") that is imaged or photo imprinted onto the fiber. Phase masks are typically made by etching grooves into a UV-transmitting silica plate using an electron beam, or by holographic exposure.

Figure 2:
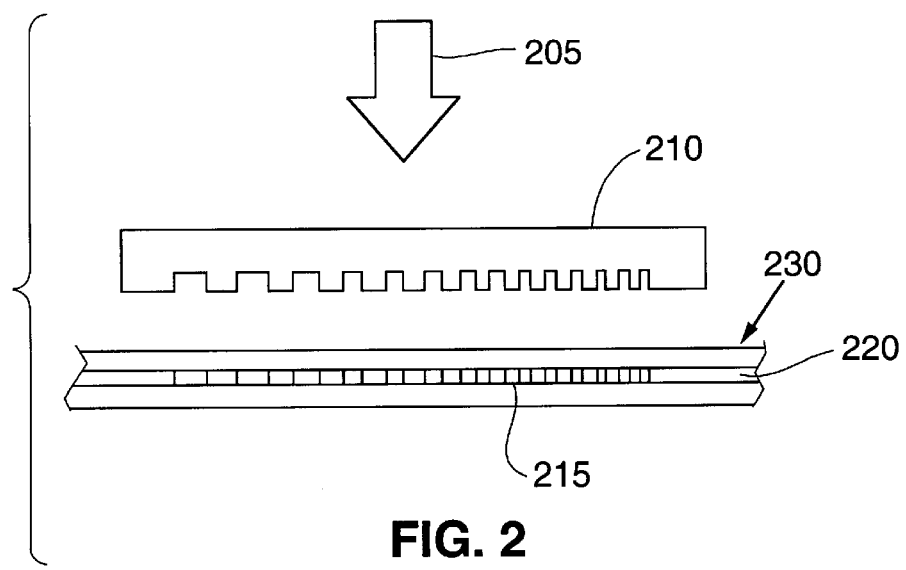
FIG. 2 depicts a method of creating an FBG using a mask.

A method of using a phase mask as a "proximity mask" is schematically shown in FIG. 2. Ultraviolet beam 205 projects an image of mask 210, producing FBG 215 in doped portion 220 of fiber 230. Mask 210 is a "chirped" grating, in which the spacing of the grooves in mask 210 varies from end to end. In another embodiment, mask 210 is not chirped, but instead has grooves with equal widths.

In an alternative embodiment, a projection masking technique may be employed by disposing imaging optics between mask 210 and fiber 230. By using optics which magnify or reduce the spacing of the grooves in mask 210, an FBG may be formed with a period (or range of periods) which is different from that of mask 210.

3. Phase Mask Interferometers

Phase masks are versatile elements and may be used in combination with various devices for producing FBG's. For example, a phase mask may be used in place of beam-splitter 110 in the holographic device shown in FIG. 1.

Figure 3:
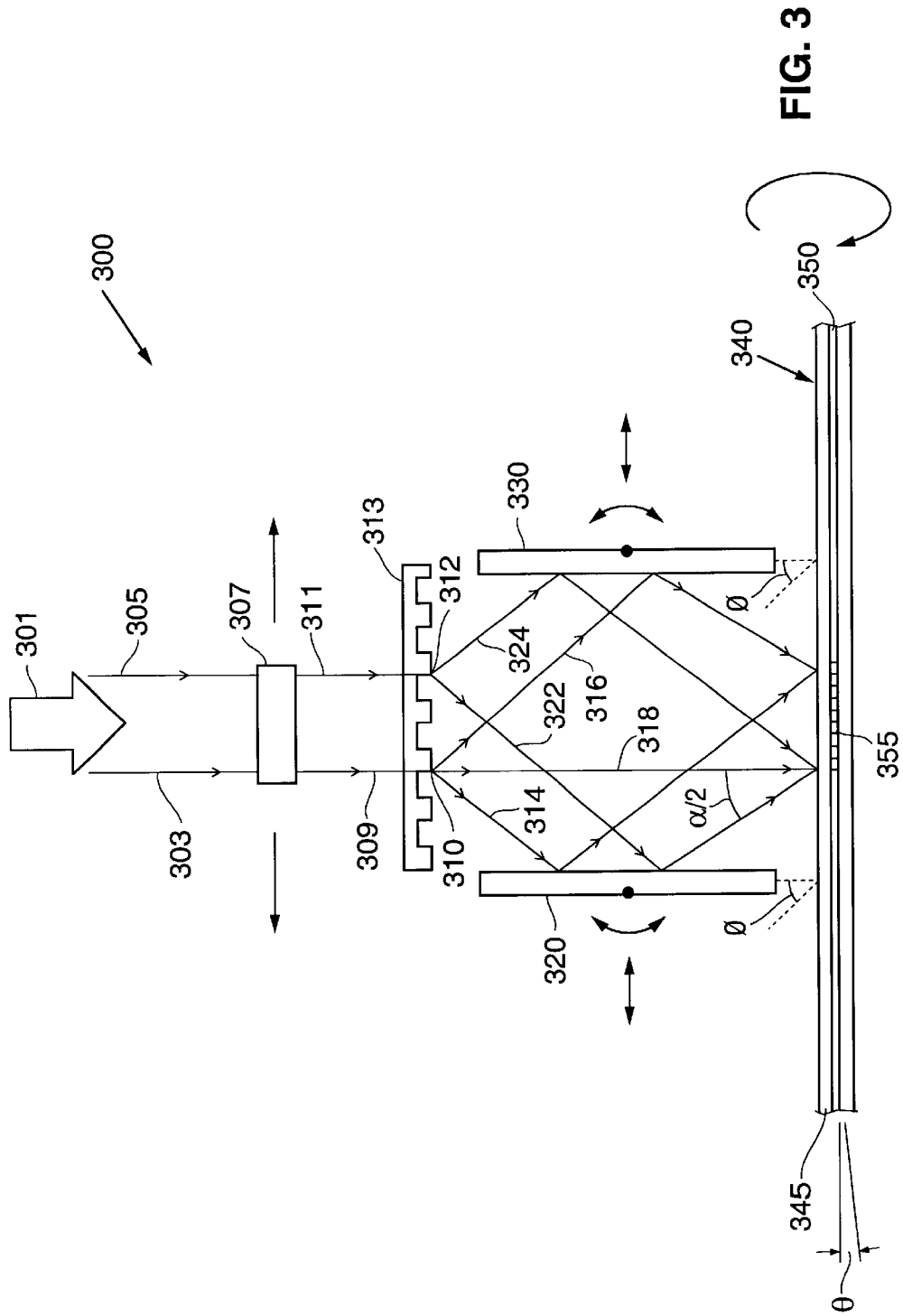
FIG. 3 illustrates a phase mask interferometer.

A phase mask may more advantageously be used in a "phase mask interferometer," in which a phase mask is used both as a beam-splitter and as a wavelength-defining element. FIG. 3 depicts a simplified version of phase mask interferometer 300. UV rays 303 and 305, which are illustrative of a plurality of rays comprising input beam 301, illuminate lens 307. Lens 307 directs rays 309 and 311 to diffraction points 310 and 312, respectively, of mask 313. Mask 313 is preferably a single-phase mask. Rays 314 and 316 are exemplary rays diffracted from diffraction point 310, and rays 322 and 324 are exemplary rays diffracted from diffraction point 312. Rays 314 and 322 are reflected by mirror 320 to fiber 340. Rays 316 and 324 are reflected by mirror 330 to fiber 340. Beams 314 and 316 intersect at doped portion 350 of fiber 340, as do rays 322 and 324, producing portions of FBG 355.

The angle between incident ray 322 and the normal to fiber 340 is known as "half-writing angle" α/2. The Bragg wavelength $\lambda_{Bragg}$ may be expressed as a function of the half-writing angle α/2 as follows:

$$\Delta\lambda/\lambda_{Bragg} = -(\Delta\alpha/2) \text{ cotangent } (\alpha/2) \qquad \text{Equation (1)}$$

The derivation of Equation (1) is explained in numerous publications and will not be repeated here. (See, e.g., Kayshap, *Fiber Bragg Gratings* (Academic Press 1999) at pp. 58–63.)

Considering Equation (1), it may be seen that phase mask interferometer 300 may be highly tunable if mirrors 320 and 330 can be moved laterally or if the distance between mask 313 and fiber 340 can be altered: either of these adjustments changes the half-writing angle and therefore changes the Bragg wavelength. Therefore, in one preferred embodiment, phase mask interferometer 300 includes an actuator and a controller for adjusting the separation between mask 313 and fiber 340, thereby changing the half-writing angle and tuning the Bragg wavelength. In another preferred embodiment, phase mask interferometer 300 includes an actuator for laterally moving at least one of mirrors 320 and 330, thereby tuning the Bragg wavelength.

It is well known by those skilled in the art that it is often advantageous to enhance the +1 and −1 orders of the interference pattern and to suppress "zero order" energy, such as that from direct ray 318. This is so because even a low-intensity zero order ray can interfere with the +1 and −1 orders, which makes FBG 355 have a period which is the same as that of mask 313. Therefore, in a method according to yet another embodiment, only one of mirrors 320 and 330 is moved laterally. This causes rays 314, 316, 322 and 324 to interfere in a region which is laterally offset from zero order ray 318, which allows FBG 355 to be made without using a zero-order component of input beam 301.

Preferably, mirrors 320 and 330 may be rotated about one or more axes. In one embodiment, mirrors 320 and 330 are rotated such that rays 314, 316, 322 and 324 are reflected out of the plane of FIG. 3, and fiber 340 is positioned where the foregoing rays are directed. Accordingly, direct ray 318 is not incident on fiber 340 and zero-order energy is suppressed.

According to another embodiment, a slanted grating is produced in fiber 355 by positioning fiber 340 at an angle Θ with respect to direct ray 318.

In another preferred embodiment, phase mask interferometer 300 includes means for rotating fiber 340 around its long axis while being exposed to UV radiation.

In yet another preferred embodiment, phase mask interferometer 300 includes actuators for moving input beam 301 and lens 307 laterally along mask 313, as indicated by the arrows adjacent to mask 313 in FIG. 3. This scanning technique allows FBG 355 to be made relatively long. The quality of FBG's produced using a scanning technique depends on the precision with which mask 313 is manufactured.

Figure 4:
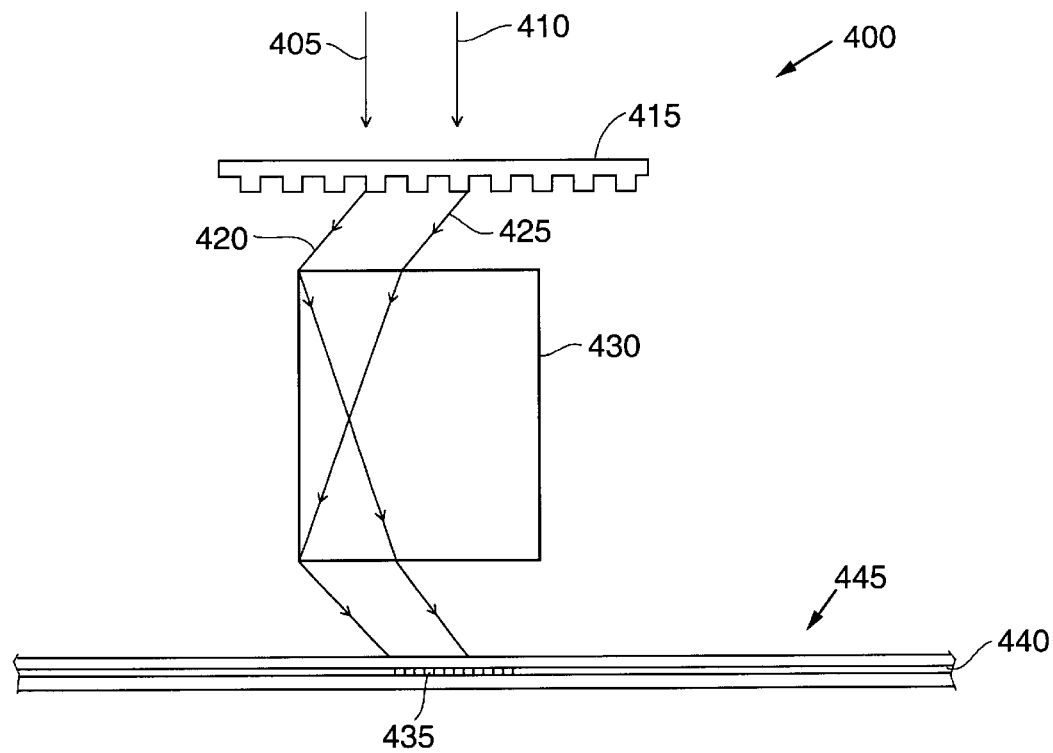
FIG. 4 illustrates a phase mask interferometer in which a block has replaced the mirrors of the interferometer shown in FIG. 3.

In the embodiment illustrated in FIG. 4, UV light rays 405 and 410 are incident upon phase mask 415. Diffracted rays 420 and 425 emitted from phase mask 415 are refracted by block 430 and produce FBG 435 in doped layer 440 of fiber 445. Block 430 replaces mirrors 320 and 330 of the device shown in FIG. 3 and provides stability to phase mask interferometer 400. Block 430 may be made of any convenient material, such as silica.

4. Lloyd Bragg Writer

Figure 5:
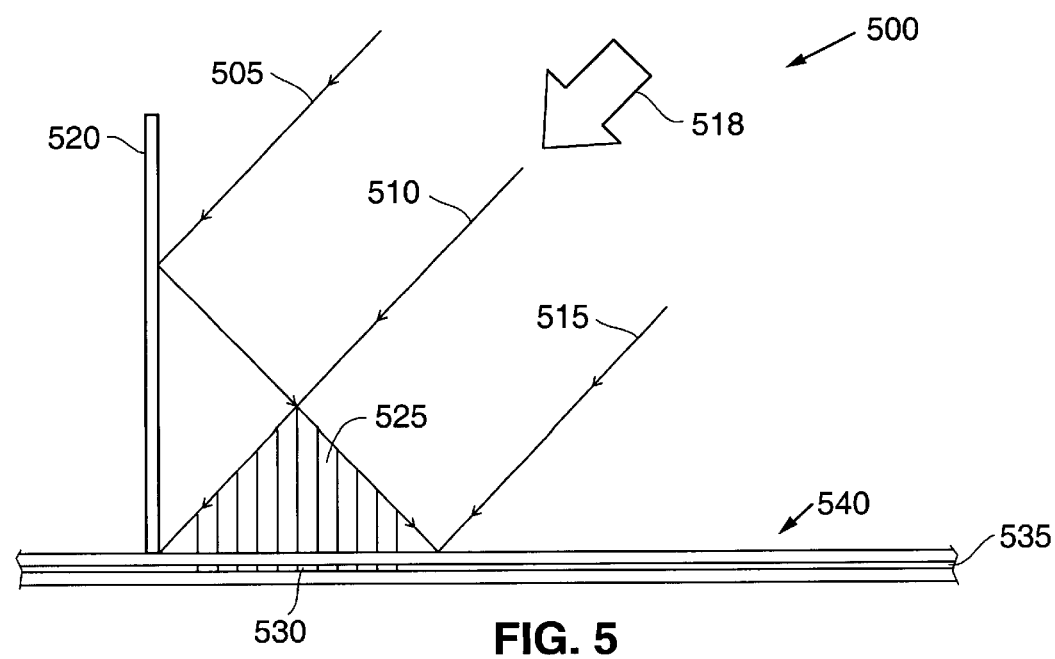
FIG. 5 illustrates a Bragg writer which uses a Lloyd mirror to create the necessary interference pattern.

Instead of splitting an incident beam and recombining the beam using mirrors, FBG's may be produced using a single "Lloyd" mirror, as shown in Lloyd Bragg writer 500 of FIG. 5. Input rays 505, 510 and 515 are parallel to one another and are examples of the many ray paths of input beam 518. Input ray 505 is reflected from mirror 520 and interferes with ray 510. The interference between rays such as 505 and 510 is shown schematically by the vertical lines in zone 525. This interference pattern causes FBG 530 in doped layer 535 of fiber 540.

Input beam 518 should have a coherence length equal to at least the path difference introduced by the "fold" in the beam. Preferably, the intensity profile and coherence properties should be relatively constant across input beam 518. Fiber 540 is preferably oriented perpendicular to mirror 520.

5. Prism Interferometers

Figure 6:
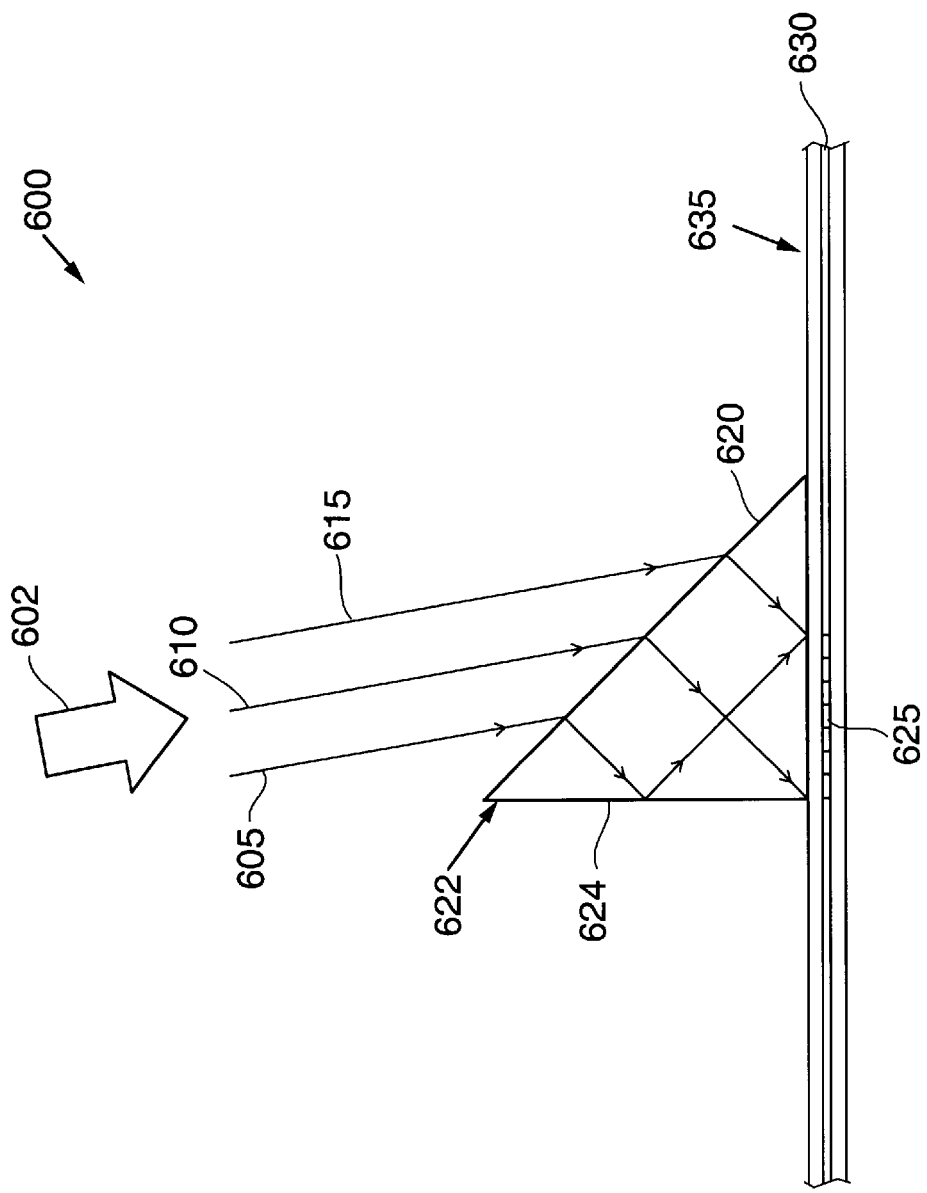
FIG. 6 illustrates a prism interferometer.

A prism interferometer operates in a similar fashion to a Lloyd mirror, except that a prism replaces the mirror. Referring to FIG. 6, selected paths of input beam 602 are shown by representative rays 605, 610 and 615. Ray 605 is refracted by inclined face 620 of prism 622, then reflected by vertical face 624 of prism 622 to interfere with rays 610 and 615, which are only refracted. The resulting interference pattern creates FBG 625 in doped portion 630 of fiber 635.

Prism 622 is preferably a right-angled prism such that input beam 602 is bisected. Prism 622 may be made of any convenient material, but is advantageously made from UV-transmitting silica. Inclined face 620 is advantageously coated by antireflection material. Prism interferometer 600 is intrinsically more stable than Lloyd Bragg writer 500, because the rays of the former device are reflected and diffracted inside prism 622 instead of in air. One embodiment of prism interferometer 600 includes an actuator for rotating prism 622, thereby tuning the Bragg wavelength of FBG 625.

B. Light Sources for FBG Production

Figure 7:
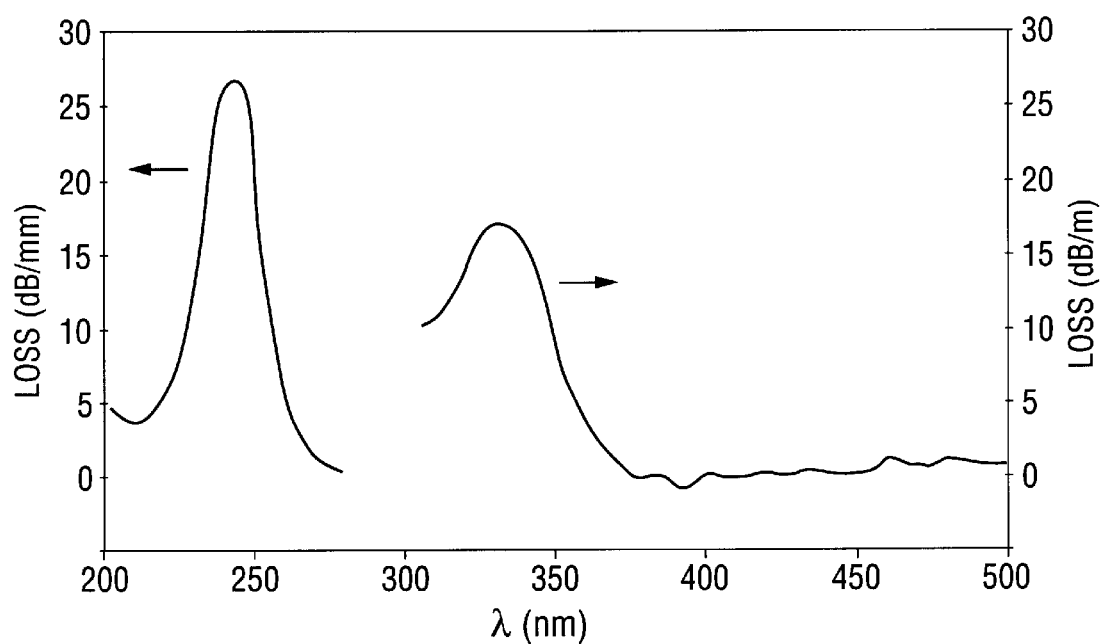
FIG. 7 is a graph of the loss spectrum of a typical germanium-doped silicate fiber.

FIG. 7 is a composite graph which indicates the loss spectrum of a typical telecommunications fiber between 200 and 500 nm. The measured fiber was a single-mode fiber with a composition of 3-mol. % germanium. The data between 200 and 275 nm were obtained using a V-groove splicing technique and are plotted with reference to the scale on the left margin of the graph. The data between 300 and 500 nm were obtained by using a standard cutback technique and are plotted with reference to the scale on the right margin of the graph.

The most well-developed diode-pumped lasers available today use Nd or Yb doped into various hosts to provide light having wavelengths of around 1.03–1.07 μm. Such lasers are typically tripled, quadrupled, or quintupled to provide ultraviolet output. Unfortunately, the wavelengths generated by these processes yield final outputs well away from the 240 nm required for the most efficient FBG production.

For example, if the fundamental frequency of a 1.03 μm (1030 um) diode-pumped laser were quadrupled, the resulting wavelength would be 257.5 nm. If the fundamental frequency were quintupled, the resulting wavelength would be 206 nm. Referring to FIG. 7, it is apparent that neither of these wavelengths would be suitable for efficient FBG production. If the fundamental frequency of a 1.07 μm (1070 nm) diode-pumped laser were quadrupled, the resulting wavelength would be 267.5 nm. If the fundamental frequency were quintupled, the resulting wavelength would be 214 nm. These wavelengths are even further from 240 nm than the harmonics of the 1.03 μm diode-pumped laser and therefore even less desirable for FBG production.

The following paragraphs describe various devices and methods for producing suitable radiation for the production of FBG's. Any of these light sources may be used with all of the previously-described Bragg writers.

1. Mixing OPO Output with Pump Laser Harmonics

Optical parametric oscillation is a nonlinear process in which a "pump" or input beam is converted by an OPO into two beams known as "signal" and "idler" beams. The input beam is not really a pump beam in the sense used to describe lasers, because the input beam does not cause stimulated emission of the OPO. The process of optical parametric oscillation allows a single-wavelength input beam to be converted into other wavelengths.

The pump, signal and idler beams must satisfy the following relationship:

$$1/\lambda_p = 1/\lambda_s + 1/\lambda_i \quad \text{Equation (2)}$$

The variables in Equation (2) are as follows:

$\lambda_p$ is the wavelength of the pump (input) beam;

$\lambda_s$ is the wavelength of the signal beam; and $\lambda_i$ the wavelength of the idler beam.

An alternative way of expressing this relationship is as follows:

$$f_p = f_s + f_i \quad \text{Equation (3)}$$

With regard to Equation (3), $f_p$ is the frequency of the pump beam;

$f_s$ is the frequency of the signal beam; and $f_i$ the frequency of the idler beam.

Because the energy of a photon is proportional to its frequency, Equation (3) follows from the requirement that the energy of the input beam must equal the combined energy of the signal and idler beams. However, from any particular pump frequency, an OPO can generate a range of signal and idler frequencies.

The output frequencies of OPO's are typically controlled by angle tuning or temperature tuning of the refractive indices of the three waves. Tuning by angle is restricted by geometric restraints determined by the length and aperture sizes of the crystal used in the OPO, the availability of broadband antireflection coatings, and the phase matching characteristics of the crystal. Typically, embodiments of the present invention use angle tuning for "coarse" adjustments (on the order of tens to hundreds of nm) and temperature tuning for fine wavelength adjustments (on the order of tens of nm or less).

Figure 8:
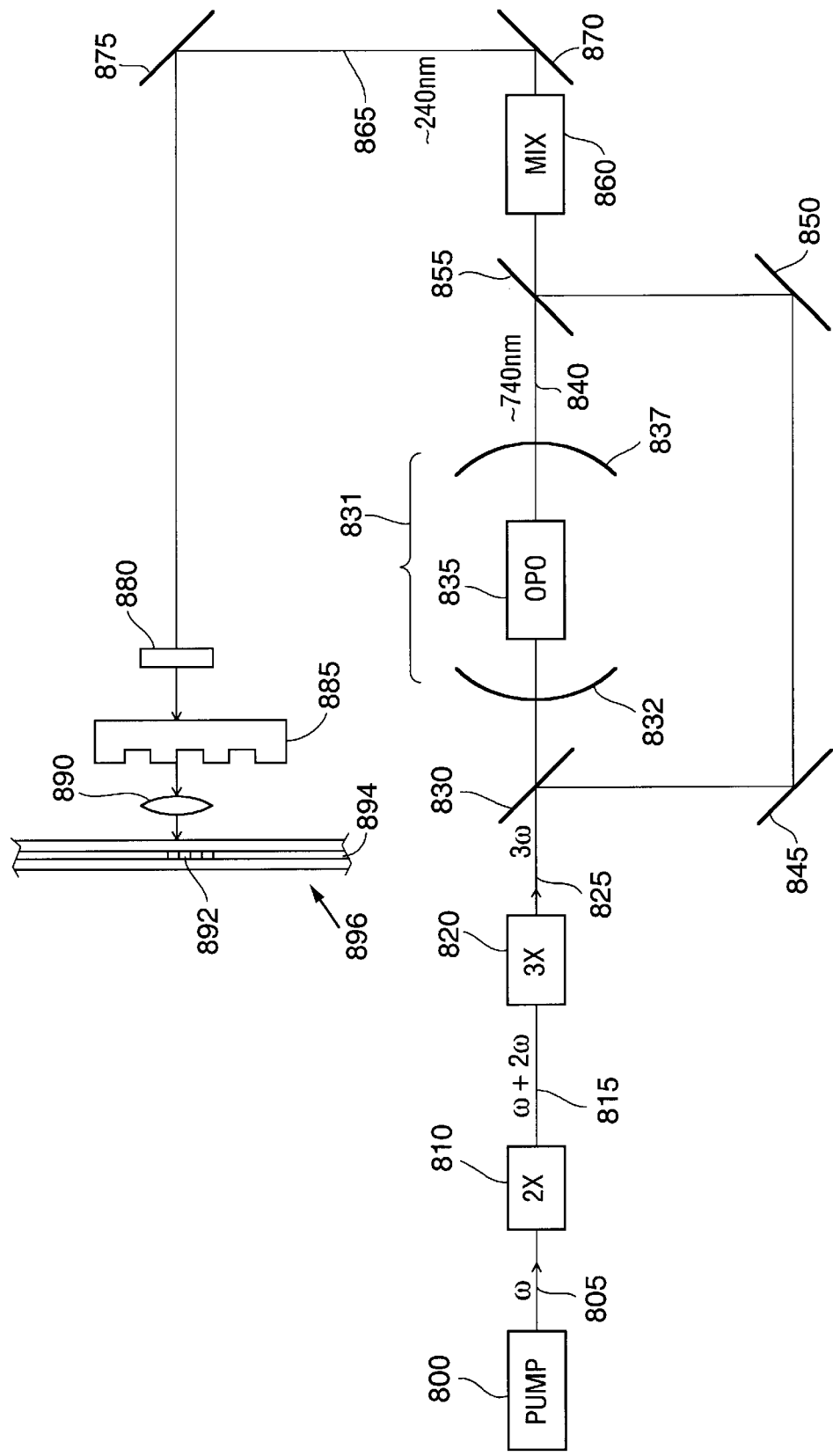
FIG. 8 illustrates an embodiment of the present invention which includes an OPO pumped by a third harmonic beam.

In an embodiment shown in FIG. 8, fundamental beam 805 from pump laser 800 is frequency doubled by doubler crystal 810. In a preferred embodiment which will be described with reference to FIG. 8, pump laser 800 is an Nd:YAG laser which emits fundamental beam 805 at approximately 1064 nm. However, pump laser 800 could be any convenient pump laser.

Fundamental beam 805 and second harmonic beam 815 are mixed in tripler crystal 820, producing third harmonic beam 825 at approximately 355 nm. Beam splitter 830 causes a portion of third harmonic beam 825 to be input to OPO 831 (consisting of OPO crystal 835, and OPO cavity mirrors 832 and 837), and a second portion of third harmonic beam 825 to be reflected by mirrors 845 and 850 to beam combiner 855.

OPO 835 is tuned to produce OPO beam 840 near 740 nm. (Of course, the OPO output will generally include distinct signal and idler wavelengths. In most embodiments, OPO beam 840 will include the wavelength desired for the next nonlinear optical step, plus an additional unutilized wavelength.) In some embodiments, the wavelength of OPO beam 840 is coarsely tuned by means of an actuator which rotates OPO crystal 835 about at least one axis according to control signals from a controller. In some embodiments, the actuator is operated by a processor using a feedback loop, such that the angle of OPO crystal 835 is automatically adjusted according to a measured wavelength of OPO beam 840, of output beam 865, or both. In such embodiments, the processor controls the actuator such that an actual wavelength of the output beam 865 or OPO beam 840 is within a predetermined number of nanometers of a desired wavelength, as indicated by a control operated by a user.

In other embodiments, the wavelength of OPO beam 840 is fine-tuned by a temperature controller. In one such embodiment, the temperature controller is a thermoelectric cooler. In another such embodiment, the temperature controller is a heater. In some embodiments, the temperature controller is operated by a processor using a feedback loop, such that the temperature of OPO crystal 835 is automatically adjusted according to a measured wavelength of OPO beam 840, of output beam 865, or both. In such embodiments, the processor controls the temperature controller such that an actual wavelength of the output beam 865 or OPO beam 840 is within a predetermined number of nanometers of a desired wavelength, as indicated by a control operated by a user.

OPO beam 840 could be a signal or an idler beam, but in the preferred embodiment OPO beam 840 is an idler beam. OPO beam 840 is then mixed with third harmonic beam 825 in mixing crystal 860 to produce output beam 865 at a wavelength near 240 nm. Generally, for a given angle and temperature of mixing crystal 860, only one of the two wavelengths produced by OPO 831 can phasematch with third harmonic beam 825. Mixing crystal 860 is oriented such that it will strongly interact with OPO beam 840, but the other beam emitted by OPO 835 will pass through mixing crystal 860 without significant interaction. Output beam 865 is reflected by mirrors 870 and 875 to lens 880, which directs output beam 865 to phase mask 885. Output beam images phase mask 885 and the image is projected by lens 890 to create FBG 892 in doped portion 894 of waveguide 896.

Materials suitable for OPO crystal 835 include (but are not limited to) lithium triborate ("LBO"), beta-barium borate ("BBO"), cesium lithium borate ("CLBO"), potassium dihydrogen phosphate ("KDP") and some related borates or KDP isomorphs (such as ammonium dihydrogen phosphate ("ADP"), rubidium dihydrogen arsenate ("RDA"), etc.). It would also be possible to use periodic-poled lithium tantalate for OPO 835, lowering the threshold for oscillation of the OPO and permitting yet lower peak power operation. Suitable materials for doubler crystal 810 include LBO, KTP and its isomorphs, KDP and its isomorphs, potassium niobate (KNB), or lithium niobate (LNB), or periodic-poled crystals of KTP (PPKTP) or LNB (PPLN). Suitable materials for tripler crystal 820 include LBO, CLBO, BBO, and KDP and its isomorphs. Suitable materials for mixing crystal 860 include BBO and CLBO.

In alternative embodiments, doubler crystal 810, tripler crystal 820 and mixing crystal 860 may be located within one or more resonators. For example, doubler crystal 810 and perhaps tripler crystal 820 could be disposed within one resonator (which could be the resonator of the pump laser 800, or a separate resonator) and OPO crystal 835 and mixing crystal 860 may be disposed within another resonator.

In the embodiment described with reference to FIG. 8, output beam 865 was used to produce an FBG using a projection mask Bragg writer. However, output beam 865 could be used with any of the previously-described Bragg writing devices.

Figure 9:
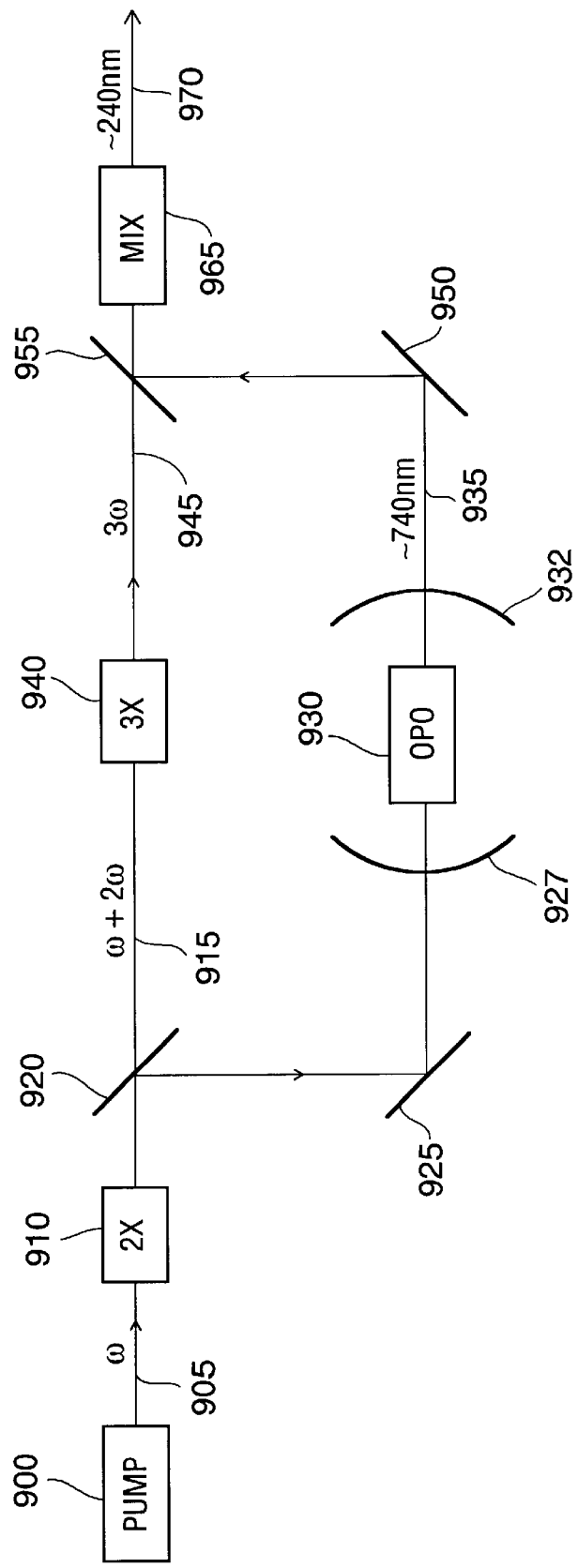
FIG. 9 illustrates an embodiment of the present invention which includes an OPO pumped by a second harmonic beam.

In an alternative embodiment shown in FIG. 9, pump laser 900 radiates fundamental beam 905, a part of which is frequency-doubled in doubler crystal 910 to produce second harmonic beam 915. In the example described with respect to FIG. 9, fundamental beam 905 has a wavelength of 1064 nm, but a range of wavelengths would be suitable for this embodiment. Beam splitter 920 reflects a portion of second harmonic beam 915 to mirror 925, which directs the reflected portion of second harmonic beam 915 to OPO 931, consisting of OPO crystal 930 and mirrors 927 and 932. Beam splitter 920 transmits fundamental beam 905 and the transmitted portion of second harmonic beam 915 to tripler crystal 940, which outputs third harmonic beam 945 to beam combiner 955.

OPO 931, is tuned to generate OPO beam 935 at approximately 740 nm. OPO crystal 930 may be composed of any of the materials mentioned with reference to FIG. 8. Alternatively, OPO crystal 930 may be composed of potassium titanyl phosphate ("KTP") or any of its isomorphs, lithium niobate, or periodic-poled lithium niobate ("PPLN"). As noted above, the use of periodic-poled materials could further lower the threshold for oscillation of the OPO and permit yet lower peak power generation.

OPO beam 935 is directed by mirror 950 to beam combiner 955, which combines OPO beam 935 with third harmonic beam 945. Combined beam 960 is directed to mixing crystal 965, which produces output beam 970 at approximately 240 nm.

Suitable materials for the second and third harmonic generation crystals and for the mixing crystal are the same as mentioned with reference to FIG. 8.

Figure 10:
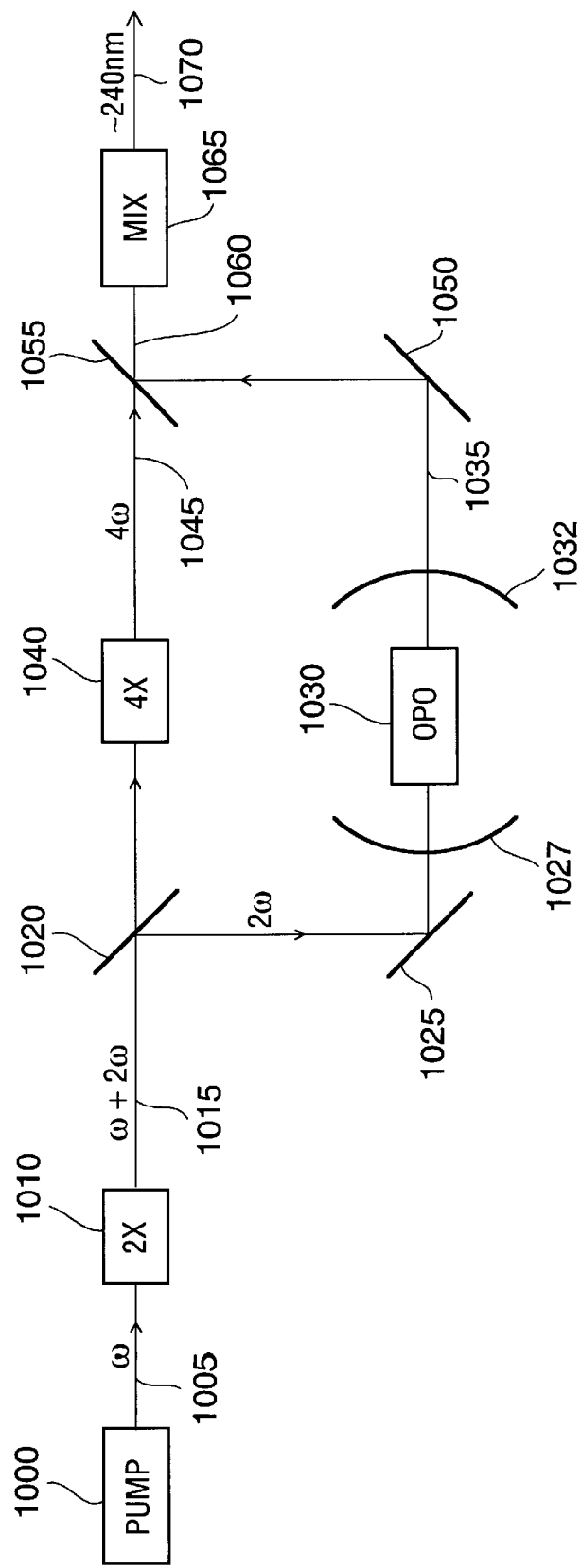
FIG. 10 illustrates an embodiment of the present invention which includes an OPO pumped by a second harmonic beam.

In the embodiment depicted in FIG. 10, pump laser 1000 emits fundamental beam 1005. In the example described with respect to FIG. 10, fundamental beam 1005 has a wavelength of 1064 nm, but a range of wavelengths would be suitable for this embodiment. Fundamental beam 1005 is directed to doubler crystal 1010, which converts a portion of fundamental beam 1005 to second harmonic beam 1015. Beam splitter 1020 reflects a portion of second harmonic beam 1015 to mirror 1025, which directs the reflected portion of second harmonic beam 1015 to OPO crystal 1030. Beam splitter 1020 transmits fundamental beam 1005 and the transmitted portion of second harmonic beam 1015 to quadrupler crystal 1040, which outputs fourth harmonic beam 1045 to beam combiner 1055.

OPO crystal 1030, situated between mirrors 1027 and 1032, is tuned to generate OPO beam 1035 at approximately 2455 nm. For this embodiment, OPO crystal 1030 may be composed of lithium niobate, or KTP or KTP isomorphs such as rubidium titanyl phosphate ("RTP"), cesium titanyl phosphate ("CTP"), potassium titanyl arsenate ("KTA"), rubidium titanyl arsenate ("RTA"), etc. Using periodic-poled lithium niobate or tantalate or KTP for OPO crystal 1030 lowers the threshold for oscillation of the OPO and permits lower peak power operation. Although the use of LBO, BBO, or CLBO is possible, their increasing optical absorption past 2 μm makes them less desirable than the other crystals. Suitable materials for doubler crystal 1010 include those for the doubler crystal mentioned with reference to FIG. 8. Suitable materials for quadrupler crystal 1040 include BBO, CLBO, and KTP and some of its isomorphs. Suitable materials for mixing crystal 1065 include LBO, BBO and CLBO.

OPO beam 1035 is directed by mirror 1050 to beam combiner 1055, which combines OPO beam 1035 with fourth harmonic beam 1045. Combined beam 1060 is directed to mixing crystal 1065, which produces output beam 1070 at approximately 240 nm.

Figure 11:
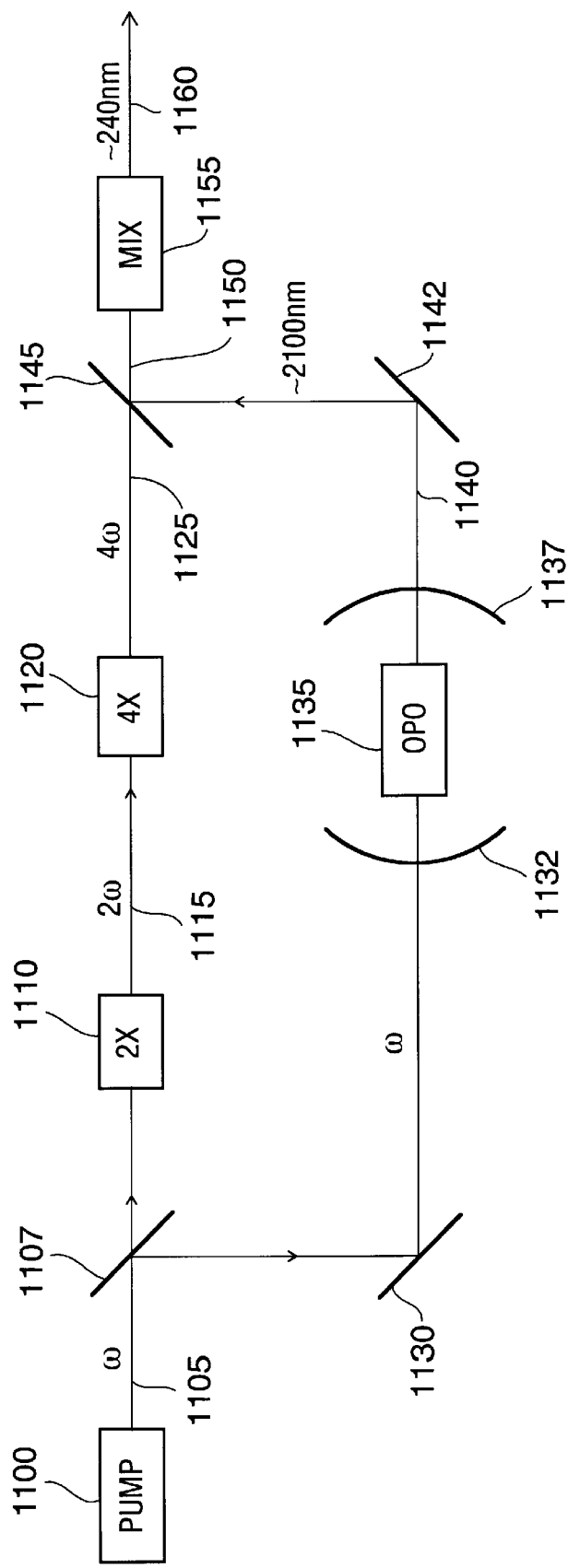
FIG. 11 illustrates an embodiment of the present invention which includes an OPO pumped by a fundamental beam.

In the embodiment shown in FIG. 11, pump laser 1100 emits fundamental beam 1105 which has a wavelength of approximately 1064 nm. However, a range of wavelengths would be suitable for this embodiment. Beam splitter 1107 transmits a portion of fundamental beam 1105 to doubler crystal 1110, which produces second harmonic beam 1115. Quadrupler crystal 1120 outputs fourth harmonic beam 1125 to beam combiner 1145. Beam splitter 1107 reflects a second portion of fundamental beam 1105 to mirror 1130, which directs fundamental beam 1105 to OPO 1131. OPO crystal 1135 is situated between mirrors 1132 and 1137 and is tuned to produce OPO beam 1140 at a wavelength of approximately 2455 nm. Mirror 1142 directs OPO beam 1140 to beam combiner 1145, which transmits fourth harmonic beam 1125 and reflects OPO beam 1140 to produce combined beam 1150. Mixing crystal 1155 mixes fourth harmonic beam 1125 and OPO beam 1140 to produce output beam 1160 at a wavelength of approximately 240 nm.

Suitable materials for OPO crystal 1135 include those for the OPO crystal mentioned with reference to FIG. 8. Again, use of periodic-poled materials further lowers the threshold for oscillation of the OPO and permits yet lower peak power operation.

2. Harmonic Conversion of OPO Output

Figure 12:
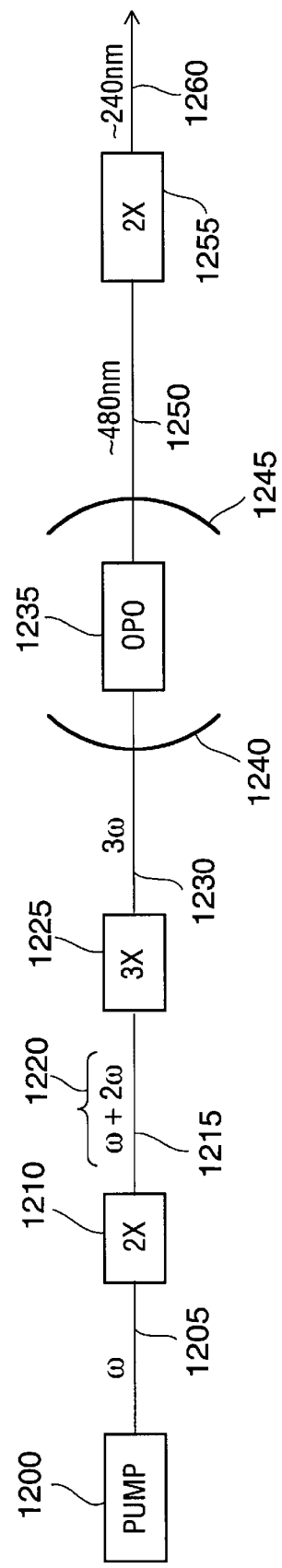
FIG. 12 illustrates an embodiment of the present invention which includes an OPO pumped by a third harmonic beam.

In yet another embodiment depicted in FIG. 12, pump laser 1200 produces fundamental beam 1205, a portion of which is frequency-doubled in doubler crystal 1210. Tripler crystal 1225 combines fundamental beam 1205 and second harmonic beam 1215 to produce third harmonic beam 1230, which is used as an input beam for OPO 1231. OPO crystal 1235 is disposed between mirrors 1240 and 1245, and produces OPO beam 1250 with a wavelength near 480 nm. Doubler crystal 1255 produces output beam 1260 at a wavelength of approximately 240 nm.

Suitable materials for OPO crystal 1235 include LBO, BBO, CLBO, KDP and its isomorphs, and periodic-poled lithium tantalate. Suitable materials for crystals 1210 and 1225 for frequency doubling and tripling include those mentioned with respect to FIG. 8. Suitable materials for doubling crystal 1255 include BBO and CLBO.

Figure 13:
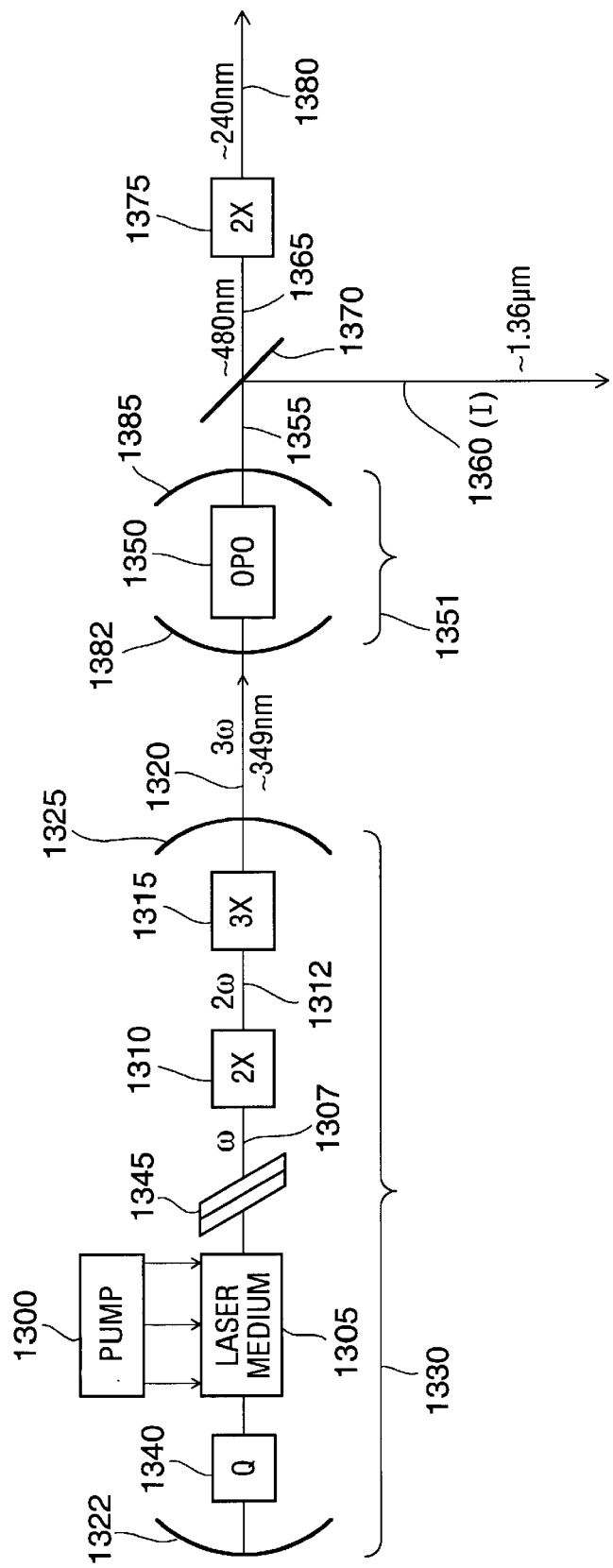
FIG. 13 illustrates an embodiment of the present invention which includes an OPO pumped by a third harmonic beam, and the output is the second harmonic of the signal beam emitted by the OPO.

In the embodiment shown in FIG. 13, exemplary elements of a laser used to pump an OPO crystal are set forth in more detail than in the foregoing embodiments. However, the elements shown in resonator 1330 could be advantageously used in any of pump lasers 800, 900, 1000, 1100, 1200, 1400, 1500, 1600, 1700 or 1800.

In FIG. 13, pump 1300 pumps laser medium 1305, which emits fundamental beam 1307. In one preferred embodiment, laser medium 1305 is an Nd:YLF crystal with a fundamental frequency of 1047 nm. However, laser medium 1305 may be formed of any suitable material, including Nd or Yb doped into various hosts to provide light having wavelengths of around 1.03–1.07 μm.

Doubler crystal 1310 partially converts fundamental beam 1307 to second harmonic beam 1312, both of which interact with tripler crystal 1315 to produce third harmonic beam 1320 at approximately 349 nm.

In this embodiment, laser medium 1305, doubler crystal 1310 and tripler crystal 1315 are disposed within mirrors 1322 and 1325, which form resonator 1330. However, doubler crystal 1310 and tripler crystal 1315 could be disposed outside of resonator 1330. For example, doubler crystal 1310 and tripler crystal 1315 could be disposed in one or more external cavities or could be located within a subresonator within resonator 1330.

Etalon 1345 is also located within resonator 1330. Etalon 1345 is optional, but may advantageously be used with the embodiments of the present invention in order to control spectral line width, and therefore enhance the coherence length of the output radiation. Narrowing the spectral line width may also serve to increase conversion efficiency of later nonlinear stages, due to limited wavelength acceptance of the nonlinear conversion processes.

Q-switch 1340 may be operated at any convenient frequency, but is preferably operated at between 5,000 and 50,000 Hz. Proper use of Q-switch 1340 is important for all pulsed-output embodiments of the present invention in order to control the peak power of the output beam, thereby reducing damage to the optical fiber during the production of FBG's. For example, if the average output power of a solid-state laser is 1 W, a 20,000 Hz. repetition rate and 100 nanosecond (ns) pulse width results in a peak power of about 500 W. If the average power is 1 W, the pulse width is 100 ns and the Q-switch is set to 5,000 Hz., the peak power is about 2,000 W. This compares favorably to the peak power of a typical excimer laser, with a repetition rate of 400 Hz. and a pulse width of 20 ns, yielding a peak power of about 125,000 W.

Third harmonic beam 1320 is used to pump OPO 1351, which produces combined beam 1355, including idler beam 1360 and signal beam 1365. In this embodiment, OPO 1351 is tuned to emit idler beam 1360 at approximately 1.28 µm and signal beam 1365 at approximately 480 nm. Beam splitter 1370 reflects idler beam 1360 and transmits signal beam 1365 to doubler crystal 1375, where signal beam 1365 is frequency-doubled to produce output at approximately 240 nm.

In this embodiment, OPO crystal 1350 is disposed within mirrors 1382 and 1385, and doubler crystal 1375 is outside of the resonator formed by mirrors 1382 and 1385. However, as disclosed in other embodiments of the present invention, doubler crystal 1375 may also be placed inside of the resonator formed by mirrors 1382 and 1385.

Pump 1300 may be any suitable pump, including a flash lamp, but is preferably a type of diode laser. Although pump 1300 is shown side-pumping laser medium 1305, pump 1300 may also be used to end-pump laser medium 1305. If pump 1300 is a diode laser, it may be an edge-emitting diode laser, a surface-emitting diode laser or a diode laser bar, or one of these types of diode lasers coupled to the laser medium 305 by means of fiber optics.

Figure 14:
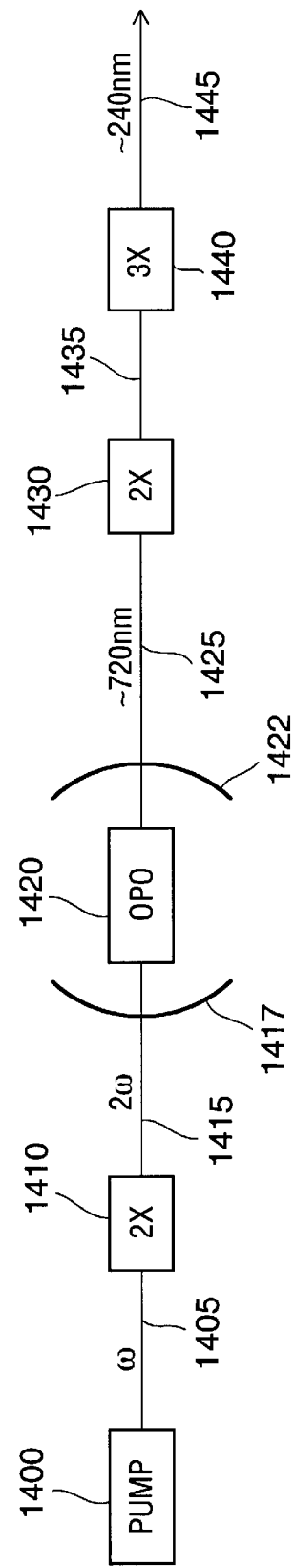
FIG. 14 illustrates an embodiment of the present invention which includes an OPO pumped by a second harmonic beam.

In another embodiment depicted in FIG. 14, pump laser 1400 produces fundamental beam 1405, which is frequency-doubled in doubler crystal 1410. Second harmonic beam 1415 pumps OPO 1420, which is disposed between mirrors 1417 and 1422. OPO beam 1425, having a wavelength of near 720 nm, is partially doubled in doubler crystal 1430. Second harmonic 1435 and OPO beam 1425 are mixed in tripler crystal 1440 to produce output radiation at about 240 nm.

Suitable materials for OPO 1420 include LBO, BBO, CLBO, KDP and its isomorphs, KTP and its isomorphs, and periodic-poled lithium niobate or tantalate. Suitable materials for frequency-doubling the OPO output include LBO, BBO, CLBO, KDP and its isomorphs, and periodic-poled lithium tantalate. Suitable materials for the frequency-tripling stage include BBO and CLBO.

3. Variations on the Basic Schemes

Figure 15:
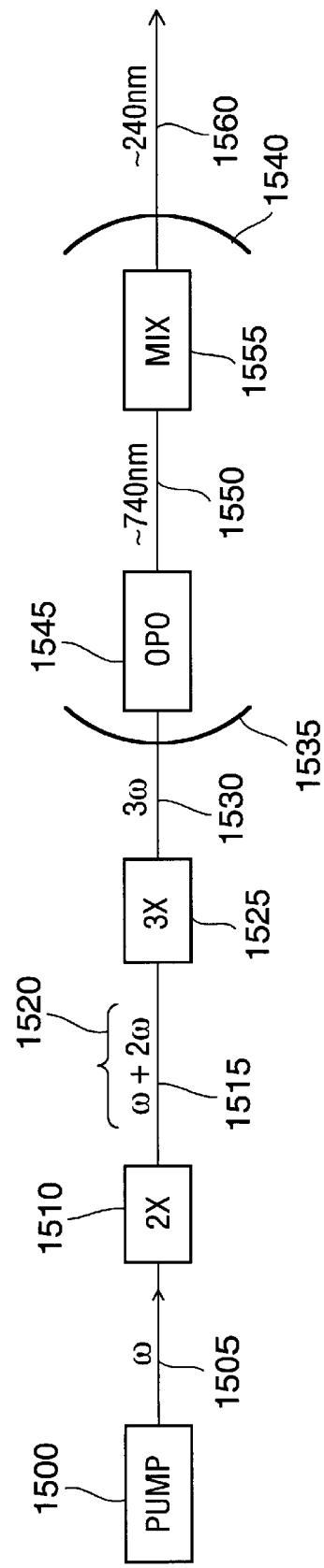
FIG. 15 illustrates an embodiment of the present invention which includes an OPO pumped by a third harmonic beam and a mixing crystal in the same resonator as the OPO.
Figure 16:
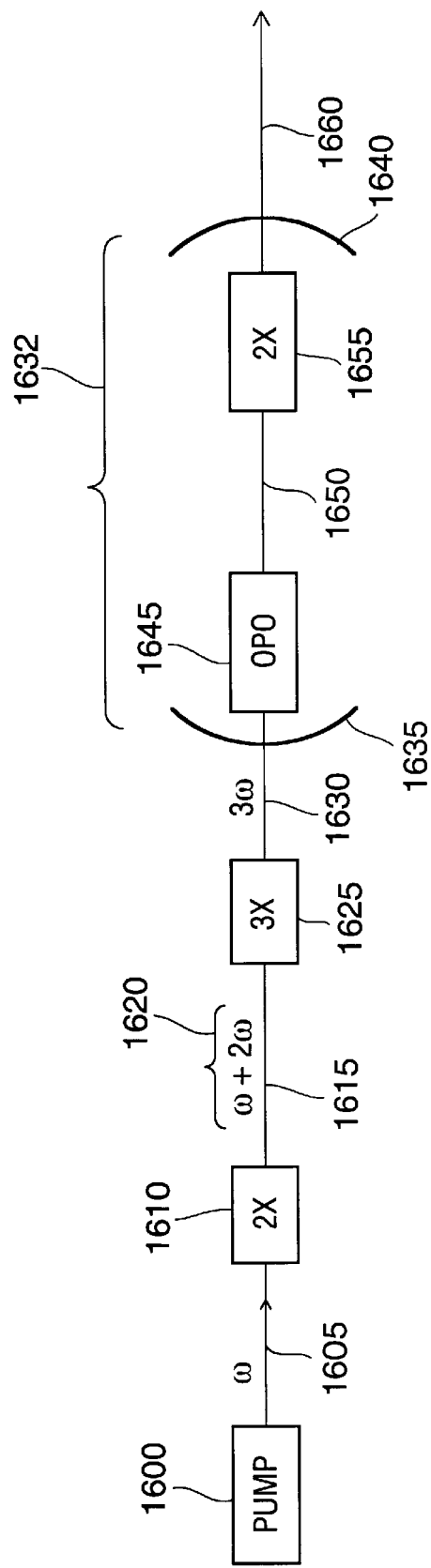
FIG. 16 illustrates an embodiment of the present invention which includes an OPO pumped by a third harmonic beam and a doubler crystal in the same resonator as the OPO.

In the wavelength conversion schemes described above, the optical parametric oscillator and the mixing stages are distinct and separate. Increased efficiency and reduced system complexity may be achieved by combining the OPO and mixing stages, so the mixing or doubling crystal is located inside the OPO cavity. FIGS. 15 and 16, respectively, illustrate these two cases.

In FIG. 15, pump laser 1500 is an Nd:YAG laser which emits fundamental beam 1505 at a wavelength of approximately 1064 nm. In alternative embodiments, pump laser 1500 may comprise other laser media, including Nd or Yb doped into various hosts to provide light having wavelengths of around 1.03–1.07 µm. Doubler crystal 1510 converts a portion of fundamental beam 1505 to second harmonic 1515 and the two beams are mixed in tripler crystal 1525 to produce third harmonic beam 1530.

In the embodiment shown in FIG. 15, both OPO crystal 1545 and mixer crystal 1555 are disposed within mirrors 1535 and 1540. However, in alternative embodiments, OPO crystal 1545 and mixer crystal 1555 are disposed within separate resonators.

OPO crystal 1545 interacts with third harmonic beam 1530 to produce OPO beam 1550 at a wavelength of approximately 740 nm. Mixing crystal 1555 mixes OPO beam 1550 and third harmonic beam 1530 to produce output beam 1560 at a wavelength of approximately 240 nm.

In FIG. 16, pump laser 1600 is an Nd:YAG laser which emits fundamental beam 1605 at a wavelength of approximately 1064 nm. In alternative embodiments, pump laser 1600 may comprise other laser media, including Nd or Yb doped into various hosts to provide light having wavelengths of around 1.03–1.07 µm. Fundamental beam 1605 interacts with doubler crystal 1610 to produce second harmonic beam 1615. Combined beam 1620 is converted by tripler crystal 1625 to third harmonic beam 1630, which is input to resonator 1632, defined by mirrors 1635 and 1640. OPO crystal 1645 generates OPO beam 1650, having a wavelength of approximately 480 nm. Doubler crystal 1655 converts OPO beam 1650 to output beam 1660, which has a wavelength of approximately 240 nm.

In both FIG. 15 and FIG. 16, the order of crystals within the cavity may be interchanged and a ring cavity may be used. A beam waist is preferably formed at each crystal.

Figure 17:
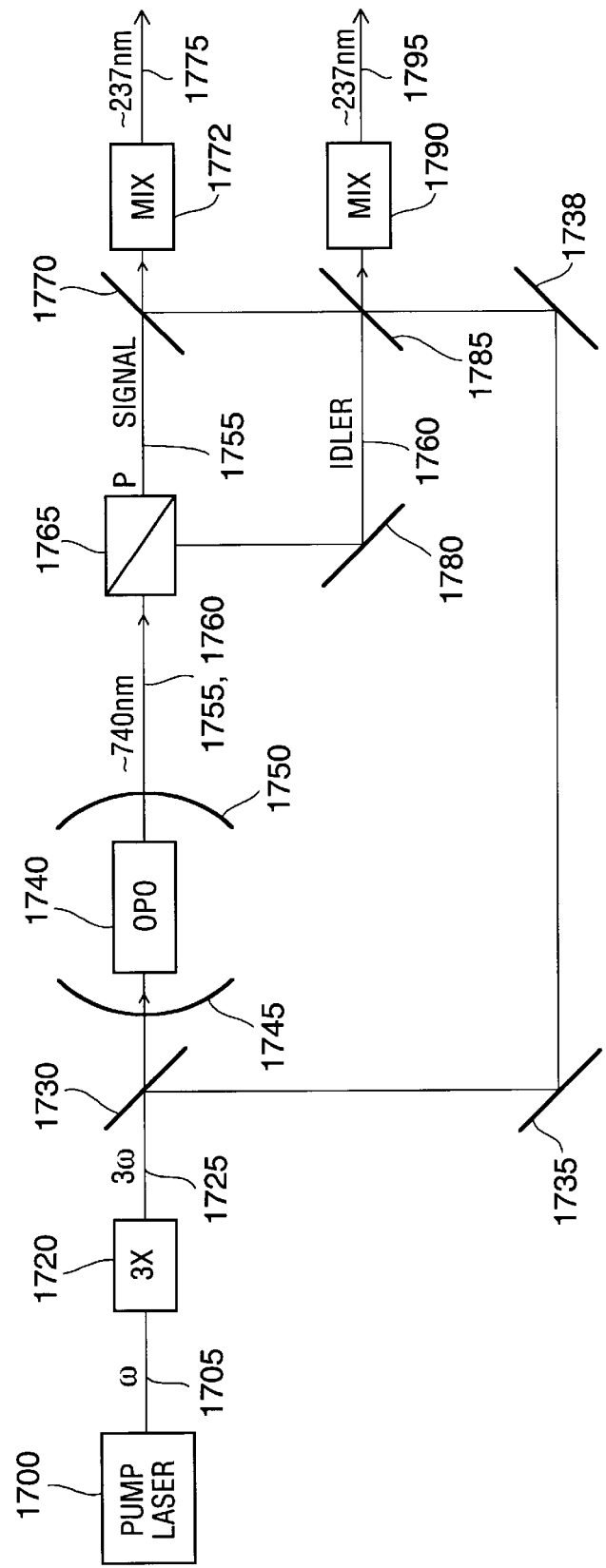
FIG. 17 illustrates an embodiment of the present invention which includes an OPO pumped by a third harmonic beam and the use of both the signal and the idler beams output by the OPO.

An alternative which achieves higher efficiency uses both the signal and idler wave from the OPO for mixing with a harmonic of the pump laser. One such embodiment is shown in FIG. 17. In this exemplary embodiment, pump laser 1700 emits fundamental beam 1705 at 1064 nm, which is converted by tripler 1720 to produce third harmonic beam 1725. Beam splitter 1730 reflects a portion of third harmonic beam 1725 to mirror 1735 and transmits a portion of third harmonic beam 1725 to OPO 1740.

In this example, OPO 1740 is disposed between mirrors 1745 and 1750, and is tuned such that signal wave 1755 and idler wave 1760 are both at approximately 740 nm. In one preferred embodiment, OPO 1740 is operated with Type II phase matching, in which the polarizations of signal wave 1755 and idler wave 1760 are orthogonal, to obtain relatively narrow bandwidths from this device.

Referring again to FIG. 17, beam splitter 1765 separates signal wave 1755 and idler wave 1760. In this embodiment, signal wave 1755 is transmitted by both beam splitter 1765 and mirror 1770 and combined with third harmonic beam 1725 in mixing crystal 1772 to produce output beam 1775 at approximately 237 nm. Idler wave 1760 is reflected by both beam splitter 1765 and mirror 1780, then transmitted by mirror 1785 and combined with third harmonic beam 1725 in mixing crystal 1790 to produce output beam 1795 at approximately 237 nm.

Figure 18:
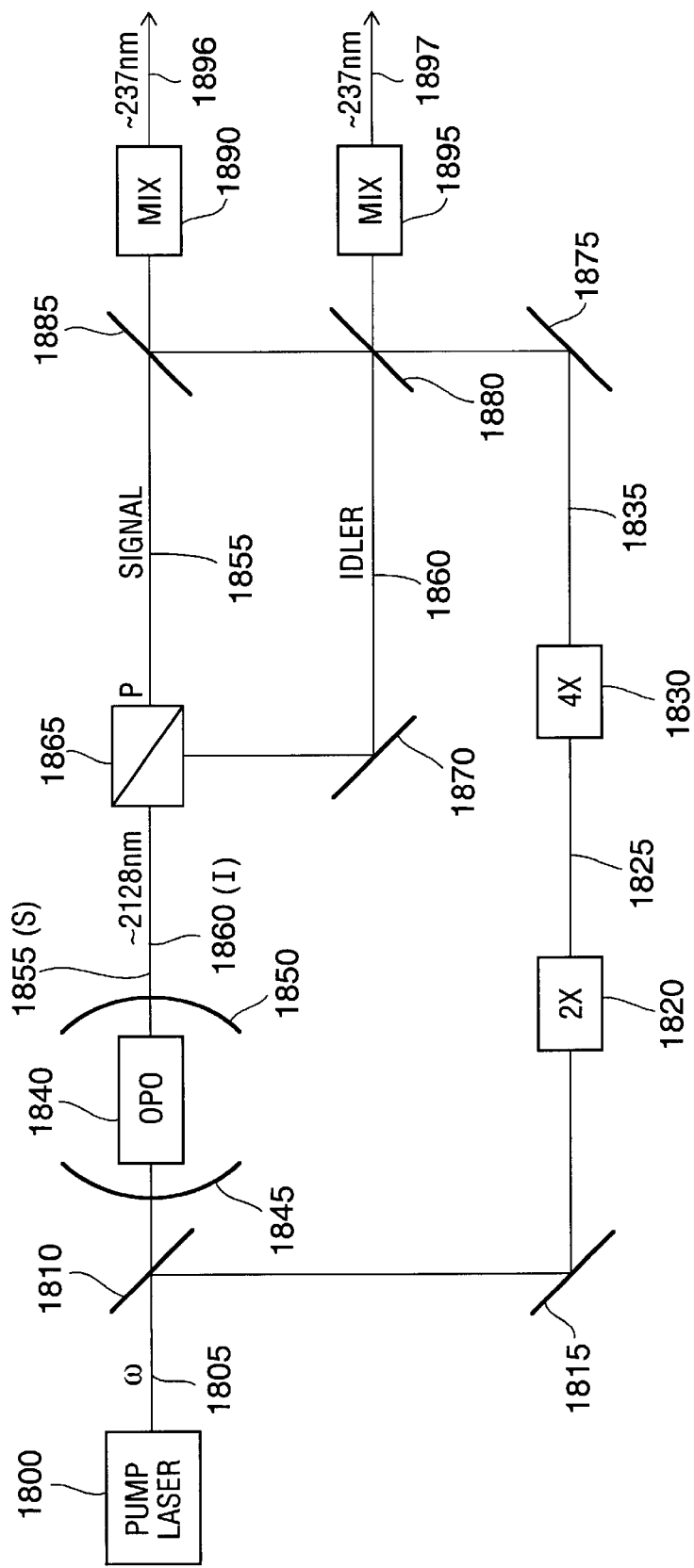
FIG. 18 illustrates an embodiment of the present invention which includes an OPO pumped by a fundamental beam and the use of both the signal and the idler beams output by the OPO.

A similar scheme is depicted in FIG. 18. In this example, pump laser 1800 emits fundamental beam 1805 at a wavelength of approximately 1064 nm. Beam splitter 1810 reflects a portion of fundamental beam 1805 to mirror 1815. Doubler crystal 1820 produces second harmonic beam 1825, which is frequency doubled by quadrupler crystal 1830 to produce fourth harmonic beam 1835.

Beam splitter 1810 reflects a portion of fundamental beam 1805 to mirror 1815, which directs fundamental beam 1805 to doubler crystal 1820. Second harmonic beam 1825 interacts with quadrupler crystal 1420 to produce fourth harmonic beam 1835, which is reflected by mirror 1875 to beam combiners 1880 and 1885.

Beam splitter 1810 transmits a second portion of fundamental beam 1805 to OPO 1840, disposed within mirrors 1845 and 1850. OPO 1840 is tuned to emit both signal beam 1855 and idler beam 1860 at approximately 2128 nm. As noted above, it is helpful (and may be necessary) to operate OPO 1840 with Type II phase matching, in which the polarizations of signal wave 1855 and idler wave 1860 are orthogonal, to obtain reasonably narrow bandwidths from this device.

Beam splitter 1865 separates signal wave 1855 and idler wave 1860. In this embodiment, beam splitter 1865 transmits signal wave 1855 to beam combiner 1885, which reflects fourth harmonic beam 1835 and transmits signal wave 1855 to interact with mixer crystal 1890 and produce output beam 1896 at approximately 237 nm.

Beam splitter 1865 reflects idler wave 1860 to mirror 1870, which directs idler wave 1860 to beam combiner 1880. Beam combiner 1880 reflects a portion of fourth harmonic beam 1835 and transmits signal wave 1855 to interact with mixer crystal 1895 and produce output beam 1897 at approximately 237 nm.

Obviously, if a pump laser wavelength other than 1064 nm is used, the output wavelength from this degenerate OPO scheme will be slightly different, but OPO 1840 may be tuned to produce output radiation near 240 nm.

Those skilled in the art will recognize that combinations of the approaches described above may be executed. For example, schemes using both the signal and idler waves from a degenerate OPO may be mixed with harmonics of the pump laser in configurations with one or both mixing crystals inside the OPO cavity.

While the best mode for practicing the invention has been described in detail, those of skill in the art will recognize that there are numerous alternative designs, embodiments, modifications and applied examples which are within the scope of the present invention. Accordingly, the scope of this invention is not limited to the previously described embodiments.

We claim:

1. An apparatus for producing a diffraction pattern in an optical waveguide, the apparatus comprising:

solid state laser means comprising an optical parametric oscillator, wherein the solid state laser means emits an output laser beam having a wavelength in the range of approximately 230 to 250 nanometers, and wherein the solid state laser means comprises means for pumping the optical parametric oscillator with a third harmonic beam; and Bragg writing means for using the output laser beam to produce the diffraction pattern on the optical waveguide.

2. The apparatus of claim 1, wherein the solid state laser means further comprises:

means for splitting the third harmonic beam into a first portion and a second portion, wherein the first portion pumps the optical parametric oscillator; and means for mixing a beam emitted by the optical parametric oscillator with the second portion.

3. The apparatus of claim 1, wherein the solid state laser means further comprises means for doubling the frequency of a beam emitted by the optical parametric oscillator.

4. The apparatus of claim 3, wherein the solid state laser means further comprises an OPO resonator means and wherein the frequency doubling means and the optical parametric oscillator are disposed within the OPO resonator means.

5. The apparatus of claim 1, wherein the pumping means comprises an active laser medium doped with a rare earth element.

6. The apparatus of claim 5, wherein the solid state laser means further comprises diode laser means for pumping the active laser medium.

7. The apparatus of claim 1, wherein the solid state laser means further comprises means for mixing a beam emitted by the optical parametric oscillator with the third harmonic beam.

8. The apparatus of claim 7, wherein the solid state laser means further comprises OPO resonator means, and wherein the mixing means and the optical parametric oscillator are disposed within the OPO resonator means.

9. An apparatus for producing a diffraction pattern in an optical waveguide, the apparatus comprising:

solid state laser means comprising an optical parametric oscillator, wherein the solid state laser means emits an output laser beam having a wavelength in the range of approximately 230 to 250 nanometers, and wherein the solid state laser means comprises means for pumping the optical parametric oscillator with a fundamental beam; and Bragg writing means for using the output laser beam to produce the diffraction pattern on the optical waveguide.

10. The apparatus of claim 9, wherein the solid state laser means further comprises:

means for splitting the fundamental beam into a first portion and a second portion, wherein the first portion pumps the optical parametric oscillator;

means for producing a fourth harmonic beam from the second portion of the fundamental beam; and means for mixing a beam emitted by the optical parametric oscillator with the fourth harmonic beam.

11. The apparatus of claim 9, wherein the solid state laser means further comprises:

means for splitting the fundamental beam into a first portion and a second portion, wherein the first portion pumps the optical parametric oscillator;

means for producing a fourth harmonic beam from the second portion of the fundamental beam;

means for separating a signal beam and an idler beam emitted by the optical parametric oscillator; and means for mixing a beam emitted by the optical parametric oscillator with the fourth harmonic beam.

12. An apparatus for producing a diffraction pattern in an optical waveguide, the apparatus comprising:
   solid state laser means comprising:
      an optical parametric oscillator, wherein the solid state laser means emits an output laser beam having a wavelength in the range of approximately 230 to 250 nanometers;
      means for pumping the optical parametric oscillator with a second harmonic beam;
      means for splitting the second harmonic beam into a first portion and a second portion, wherein the first portion pumps the optical parametric oscillator;
      means for mixing the second portion of the second harmonic beam and a fundamental beam to produce a third harmonic beam; and
      means for mixing a bam emitted by the optical parametric oscillator with the third harmonic beam; and
   Bragg writing means for using the output laser beam to produce the diffraction pattern on the optical waveguide.

13. An apparatus for producing a diffraction pattern in an optical waveguide, the apparatus comprising:
   solid state laser means comprising:
      an optical parametric oscillator, wherein the solid state laser means emits an output laser beam having a wavelength in the range of approximately 230 to 250 nanometers;
      means for pumping the optical parametric oscillator with a second harmonic beam;
      means for tripling a frequency of a beam emitted by the optical parametric oscillator; and
   Bragg writing means for using the output laser beam to produce the diffraction pattern on the optical waveguide.

14. An apparatus for producing a diffraction pattern in an optical waveguide, the apparatus comprising:
   a solid state laser comprising:
      an optical parametric oscillator, wherein the solid state laser emits an output laser beam having a wavelength in the range of approximately 230 to 250 nanometers;
      an active laser medium which emits a fundamental beam;
      a first doubler crystal for producing a second harmonic beam from the fundamental beam; and
      a tripler crystal for producing a third harmonic beam from the doubler crystal and the fundamental beam, wherein the optical parametric oscillator is pumped by the third harmonic beam; and
   a Bragg writer for using the output laser beam to produce the diffraction pattern on the optical waveguide.

15. The apparatus of claim 14, the active laser medium is doped with a rare earth element.

16. The apparatus of claim 14, wherein the solid state laser further comprises a mixing crystal for mixing a beam emitted by the optical parametric oscillator with the third harmonic beam.

17. The apparatus of claim 14, wherein the solid state laser further comprises:
   a beam splitter for splitting the third harmonic beam into a first portion and a second portion, wherein the first portion pumps the optical parametric oscillator; and
   a mixing crystal for mixing a beam emitted by the optical parametric oscillator with the second portion.

18. The apparatus of claim 14, wherein the solid state laser further comprises a second doubler crystal for doubling the frequency of a beam emitted by the optical parametric oscillator.

19. The apparatus of claim 18, wherein the solid state laser further comprises a resonating cavity, and wherein the frequency doubling means and the optical parametric oscillator are disposed within the resonating cavity.

20. The apparatus of claim 16, wherein the solid state laser further comprises a resonating cavity, and wherein the mixing crystal and the optical parametric oscillator are disposed within the resonating cavity.

21. The apparatus of claim 15, wherein the solid state laser further comprises a diode laser for pumping the active laser medium.

22. An apparatus for producing a diffraction pattern in an optical waveguide, the apparatus comprising:
   a solid state laser comprising:
      an optical parametric oscillator, wherein the solid state laser emits an output laser beam having a wavelength in the range of approximately 230 to 250 nanometers; and
      an active laser medium which emits a fundamental beam, wherein the optical parametric oscillator is pumped with the fundamental beam; and
   a Bragg writer for using the output laser beam to produce the diffraction pattern on the optical waveguide.

23. The apparatus of claim 22, wherein the solid state laser further comprises:
   a beam splitter for splitting the fundamental beam into a first portion and a second portion, wherein the first portion pumps the optical parametric oscillator;
   at least one crystal for producing a fourth harmonic beam from the second portion of the fundamental beam; and
   a mixing crystal for mixing a beam emitted by the optical parametric oscillator with the fourth harmonic beam.

24. The apparatus of claim 22, wherein the solid state laser further comprises:
   a first beam splitter for splitting the fundamental beam into a first portion and a second portion, wherein the first portion pumps the optical parametric oscillator;
   a least one crystal for producing a fourth harmonic beam from the second portion of the fundamental beam;
   a second beam splitter for separating a signal beam and an idler beam emitted by the optical parametric oscillator; and
   a mixing crystal for mixing a beam emitted by the optical parametric oscillator with the fourth harmonic beam.

25. An apparatus for producing a diffraction pattern in an optical waveguide, the apparatus comprising:
   a solid state laser comprising:
      an optical parametric oscillator, wherein the solid state laser emits an output laser beam having a wavelength in the range of approximately 230 to 250 nanometers;
      an active laser medium which emits a fundamental beam;
      a doubler crystal for producing a second harmonic beam from the fundamental beam;
      a beam splitter for splitting the second harmonic beam into a first portion and a second portion, wherein the first portion pumps the optical parametric oscillator;
      a tripler crystal for mixing the second portion of the second harmonic beam and a fundamental beam to produce a third harmonic beam; and a mixing crystal for mixing a beam emitted by the optical parametric oscillator with the third harmonic beam; and a Bragg writer for using the output laser beam to produce the diffraction pattern on the optical waveguide.

26. An apparatus for producing a diffraction pattern in an optical waveguide, the apparatus comprising:
a solid state laser comprising:
an optical parametric oscillator, wherein the solid state laser emits an output laser beam having a wavelength in the range of approximately 230 to 250 nanometers;
an active laser medium which emits a fundamental beam;
a doubler crystal for producing a second harmonic beam from the fundamental beam, wherein the optical parametric oscillator is pumped by the second harmonic beam; and
at least one crystal for tripling a frequency of a beam emitted by the optical parametric oscillator; and
a Bragg writer for using the output laser beam to produce the diffraction pattern on the optical waveguide.

27. A method for producing a diffraction pattern in an optical waveguide, the method comprising:
splitting a third harmonic beam into a first portion and a second portion;
pumping an optical parametric oscillator with the first portion;
mixing an idler beam emitted by the optical parametric oscillator with the second portion to produce an output laser beam having a wavelength in the range of approximately 230 to 250 nanometers; and
writing a Bragg grating on a waveguide by using the output laser beam to produce the diffraction pattern on the optical waveguide.

28. An apparatus for producing a Bragg grating in an optical waveguide, the apparatus comprising:
a solid state laser comprising an optical parametric oscillator, wherein the solid state laser emits an output beam having a wavelength in the range of approximately 230 to 250 nanometers;
a phase mask for diffracting rays from the output beam;
a first mirror;
a second mirror; and
means for translating at least one of the first mirror and the second mirror, wherein:
the first mirror and the second mirror reflect a first ray and a second ray diffracted by the phase mask;
the translating means translates said at least one mirror to cause the first ray and the second ray to produce a portion of the Bragg grating in a first area of the optical waveguide; and
a ray not reflected by the first mirror or the second mirror illuminates a second area of the optical waveguide; and
means for rotating the optical waveguide.

29. An apparatus for producing a Bragg grating in an optical waveguide, the apparatus comprising:
an optical parametric oscillator;
a first beam splitter for splitting a fundamental beam into a first portion and a second portion, wherein the first portion pumps the optical parametric oscillator;
at least one crystal for producing a fourth harmonic beam from the second portion of the fundamental beam;

a second beam splitter for separating a signal beam and an idler beam emitted by the optical parametric oscillator;
a mixing crystal for mixing a beam emitted by the optical parametric oscillator with the fourth harmonic beam to produce an output beam having a wavelength in the range of approximately 230 to 250 nanometers; and
a proximity mask for using the output beam to produce the Bragg grating in the optical waveguide.

30. An apparatus for producing a Bragg grating in an optical waveguide, the apparatus comprising:
a pump laser;
a first doubler crystal for doubling the frequency of a first portion of a fundamental beam emitted by the pump laser to produce a second harmonic beam;
a tripler crystal for mixing the fundamental beam and the second harmonic beam to produce a third harmonic beam;
an optical parametric oscillator which is pumped by the third harmonic beam to produce an OPO beam;
a second doubler crystal for doubling a frequency of the OPO beam to produce an output beam having a wavelength in the range of approximately 230 to 250 nanometers; and
a Lloyd mirror for using the output beam to produce the Bragg grating in the optical waveguide.

31. An apparatus for producing a Bragg grating in an optical waveguide, the apparatus comprising:
an active laser medium;
a pump for pumping the active laser medium to emit a fundamental beam;
a Q switch for producing periodic emissions of the fundamental beam from the active laser medium;
an etalon for controlling a line width of the fundamental beam;
a first doubler crystal for producing a second harmonic beam from the fundamental beam;
a tripler crystal for producing a third harmonic beam from the second harmonic and the fundamental beam;
an optical parametric oscillator which is pumped by the third harmonic beam to produce a fundamental OPO beam;
a second doubler crystal for doubling a frequency of the OPO beam to produce an output beam having a wavelength in the range of approximately 230 to 250 nanometers;
a prism interferometer for using the output beam to produce the Bragg grating in the optical waveguide, wherein the prism interferometer comprises:
a prism; and
means for rotating the prism to control a Bragg wavelength of the Bragg grating.

32. An apparatus for producing a Bragg grating in an optical waveguide, the apparatus comprising:
a pump laser;
a doubler crystal for doubling the frequency of a first portion of a fundamental beam emitted by the pump laser to produce a second harmonic beam;
a tripler crystal for mixing the fundamental beam and the second harmonic beam to produce a third harmonic beam;
an optical parametric oscillator which is pumped by the second harmonic beam to produce an OPO beam;
a mixing crystal for mixing the OPO beam and the third harmonic beam to produce an output beam having a wavelength in the range of approximately 230 to 250 nanometers; and phase mask projection means for using the output beam to produce the Bragg grating in the optical waveguide.

33. An apparatus for producing a Bragg grating in an optical waveguide, the apparatus comprising:

a pump laser for generating a fundamental pump beam;

a nonlinear crystal for generating a harmonic pump beam from the fundamental pump beam;

an optical parametric oscillator which is pumped by the harmonic pump beam to produce an GPO beam;

means for producing an output beam having a wavelength in the range of approximately 230 to 250 nanometers from the GPO beam;

a processor;

means for rotating the optical parametric oscillator according to control signals from the processor;

means for controlling a temperature of the optical parametric oscillator according to control signals from the processor;

means for measuring a wavelength of the output beam and for sending a measurement signal to the processor;

a control for sending a wavelength signal to the processor, the wavelength signal indicating a desired wavelength of the output beam; and Bragg writing means for using the output beam to produce the Bragg grating in the optical waveguide, wherein the processor controls the rotation means and the temperature control means such that an actual wavelength of the output beam is within a predetermined number of nanometers of the desired wavelength.

* * * * *